(12) United States Patent
Jacobs, II

(10) Patent No.: US 11,423,449 B1
(45) Date of Patent: Aug. 23, 2022

(54) ELECTRONIC PRICING MACHINE CONFIGURED TO GENERATE PRICES BASED ON SUPPLIER WILLINGNESS AND A USER INTERFACE THEREFOR

(71) Applicant: Desprez, LLC, New London, NH (US)

(72) Inventor: James L. Jacobs, II, Amherst, NH (US)

(73) Assignee: Desprez, LLC, New London, NH (US)

( * ) Notice: Subject to any disclaimer, the term of this patent is extended or adjusted under 35 U.S.C. 154(b) by 796 days.

(21) Appl. No.: 15/467,079

(22) Filed: Mar. 23, 2017

Related U.S. Application Data

(60) Provisional application No. 62/312,165, filed on Mar. 23, 2016.

(51) Int. Cl.
| | | |
|---|---|---|
| G06Q 30/02 | (2012.01) | |
| G06Q 30/06 | (2012.01) | |
| G06F 30/00 | (2020.01) | |

(52) U.S. Cl.
CPC ......... *G06Q 30/0283* (2013.01); *G06F 30/00* (2020.01); *G06Q 30/0611* (2013.01)

(58) Field of Classification Search
CPC . G06Q 30/0283; G06Q 30/0611; G06F 17/50
USPC ...................................................... 705/26.4
See application file for complete search history.

(56) References Cited

U.S. PATENT DOCUMENTS

| | | |
|---|---|---|
| 4,495,559 A | 1/1985 | Gelatt, Jr. et al. |
| 5,117,354 A | 5/1992 | Long |
| 5,465,221 A | 11/1995 | Merat et al. |
| 5,495,430 A | 2/1996 | Matsunari et al. |

(Continued)

FOREIGN PATENT DOCUMENTS

| | | |
|---|---|---|
| CN | 2112190 U | 8/1992 |
| WO | 154476 A2 | 8/2001 |

(Continued)

OTHER PUBLICATIONS

Ficko, Mirko, et al. "Prediction of total manufacturing costs for stamping tool on the basis of CAD-model of finished product." Journal of materials processing technology 164 (2005): 1327-1335. (Year: 2005).*

(Continued)

*Primary Examiner* — Marissa Thein
*Assistant Examiner* — Elisa H Yang
(74) *Attorney, Agent, or Firm* — Caldwell Intellectual Property Law

(57) ABSTRACT

Methods and software facilitate supplier willingness awareness in a marketplace of suppliers of structures represented and/or specified in a design. In some embodiments, methods and software of the present disclosure allow each of any one or more designers participating in an automated marketplace to view a list of suppliers that are willing to fabricate a particular design and/or prices associated with fabricating such a design such that the designers can quickly and easily identify suppliers that are not only capable of fabricating particular designs but also willing to do so. Such a list may be generated by comparing a list of objective requirements for a design, which may be generated from fabrication data associated with a designer's request for price or computer aided design file, to willingness data associated with one or more suppliers.

18 Claims, 6 Drawing Sheets

(56) References Cited

U.S. PATENT DOCUMENTS

| | | | |
|---|---|---|---|
| 5,552,995 A | 9/1996 | Sebastian | |
| 5,570,291 A | 10/1996 | Dudle et al. | |
| 5,655,087 A | 8/1997 | Hino et al. | |
| 5,758,328 A | 5/1998 | Giovannoli | |
| 5,847,971 A | 12/1998 | Ladner et al. | |
| 5,870,719 A | 2/1999 | Maritzen et al. | |
| 5,937,189 A | 8/1999 | Branson et al. | |
| 6,031,535 A | 2/2000 | Barton | |
| 6,112,133 A | 8/2000 | Fishman | |
| 6,295,513 B1 * | 9/2001 | Thackston | G05B 19/4099 703/1 |
| 6,341,271 B1 | 1/2002 | Salvo et al. | |
| 6,343,285 B1 | 1/2002 | Tanaka et al. | |
| 6,611,725 B1 | 8/2003 | Harrison | |
| 6,647,373 B1 | 11/2003 | Carlton-Foss | |
| 6,701,200 B1 | 3/2004 | Lukis et al. | |
| 6,750,864 B1 | 6/2004 | Anwar | |
| 6,834,312 B2 | 12/2004 | Edwards et al. | |
| 6,836,699 B2 | 12/2004 | Lukis et al. | |
| 6,859,768 B1 | 2/2005 | Wakelam et al. | |
| 6,917,847 B2 | 7/2005 | Littlejohn et al. | |
| 6,922,701 B1 | 7/2005 | Ananian et al. | |
| 7,006,084 B1 | 2/2006 | Buss et al. | |
| 7,058,465 B2 | 6/2006 | Emori et al. | |
| 7,079,990 B2 | 7/2006 | Haller et al. | |
| 7,085,687 B2 | 8/2006 | Eckenwiler et al. | |
| 7,089,082 B1 | 8/2006 | Lukis et al. | |
| 7,123,986 B2 | 10/2006 | Lukis et al. | |
| 7,134,096 B2 | 11/2006 | Brathwaite et al. | |
| 7,299,101 B2 | 11/2007 | Lukis et al. | |
| 7,305,367 B1 | 12/2007 | Hollis et al. | |
| 7,327,869 B2 | 2/2008 | Boyer | |
| 7,343,212 B1 | 3/2008 | Brearley et al. | |
| 7,359,886 B2 | 4/2008 | Sakurai et al. | |
| 7,366,643 B2 | 4/2008 | Verdura et al. | |
| 7,369,970 B2 | 5/2008 | Shimizu et al. | |
| 7,418,307 B2 | 8/2008 | Katircioglu | |
| 7,467,074 B2 | 12/2008 | Faruque et al. | |
| 7,496,487 B2 | 2/2009 | Wakelam et al. | |
| 7,496,528 B2 | 2/2009 | Lukis et al. | |
| 7,499,871 B1 | 3/2009 | McBrayer et al. | |
| 7,523,411 B2 | 4/2009 | Carlin | |
| 7,526,358 B2 | 4/2009 | Kawano et al. | |
| 7,529,650 B2 | 5/2009 | Wakelam et al. | |
| 7,565,139 B2 | 7/2009 | Neven, Sr. et al. | |
| 7,565,223 B2 | 7/2009 | Moldenhauer et al. | |
| 7,567,849 B1 | 7/2009 | Trammell et al. | |
| 7,568,155 B1 | 7/2009 | Axe et al. | |
| 7,571,166 B1 | 8/2009 | Davies et al. | |
| 7,574,339 B2 | 8/2009 | Lukis et al. | |
| 7,590,466 B2 | 9/2009 | Lukis et al. | |
| 7,590,565 B2 | 9/2009 | Ward et al. | |
| 7,603,191 B2 | 10/2009 | Gross | |
| 7,606,628 B2 | 10/2009 | Azuma | |
| 7,630,783 B2 | 12/2009 | Walls-Manning et al. | |
| 7,656,402 B2 | 2/2010 | Abraham et al. | |
| 7,689,936 B2 | 3/2010 | Rosel | |
| 7,733,339 B2 | 6/2010 | Laning et al. | |
| 7,747,469 B2 | 6/2010 | Hinman | |
| 7,748,622 B2 | 7/2010 | Schon et al. | |
| 7,761,319 B2 | 7/2010 | Gil et al. | |
| 7,822,682 B2 | 10/2010 | Arnold et al. | |
| 7,836,573 B2 | 11/2010 | Lukis et al. | |
| 7,840,443 B2 | 11/2010 | Lukis et al. | |
| 7,908,200 B2 | 3/2011 | Scott et al. | |
| 7,957,830 B2 | 6/2011 | Lukis et al. | |
| 7,979,313 B1 | 7/2011 | Baar | |
| 7,993,140 B2 | 8/2011 | Sakezles | |
| 8,000,987 B2 | 8/2011 | Hickey et al. | |
| 8,024,207 B2 | 9/2011 | Ouimet | |
| 8,140,401 B2 | 3/2012 | Lukis et al. | |
| 8,170,946 B2 | 5/2012 | Blair et al. | |
| 8,175,933 B2 | 5/2012 | Cook, Jr. et al. | |
| 8,180,396 B2 | 5/2012 | Athsani et al. | |
| 8,209,327 B2 | 6/2012 | Danish et al. | |
| 8,239,284 B2 | 8/2012 | Lukis et al. | |
| 8,249,329 B2 | 8/2012 | Silver | |
| 8,271,118 B2 | 9/2012 | Pietsch et al. | |
| 8,275,583 B2 | 9/2012 | Devarajan et al. | |
| 8,295,971 B2 | 10/2012 | Krantz | |
| 8,417,478 B2 | 4/2013 | Gintis et al. | |
| 8,441,502 B2 | 5/2013 | Reghetti et al. | |
| 8,515,820 B2 | 8/2013 | Lopez et al. | |
| 8,554,250 B2 | 10/2013 | Linaker | |
| 8,571,298 B2 | 10/2013 | McQueen et al. | |
| 8,595,171 B2 | 11/2013 | Qu | |
| 8,700,185 B2 | 4/2014 | Yucel et al. | |
| 8,706,607 B2 | 4/2014 | Sheth et al. | |
| 8,768,651 B2 | 7/2014 | Bhaskaran et al. | |
| 8,798,324 B2 | 8/2014 | Conradt | |
| 8,806,398 B2 | 8/2014 | Brathwaite et al. | |
| 8,830,267 B2 | 9/2014 | Brackney | |
| 8,849,636 B2 | 9/2014 | Becker et al. | |
| 8,861,005 B2 | 10/2014 | Grosz | |
| 8,874,413 B2 | 10/2014 | Mulligan et al. | |
| 8,923,650 B2 | 12/2014 | Wexler | |
| 8,977,558 B2 | 3/2015 | Nielsen et al. | |
| 9,037,692 B2 | 5/2015 | Ferris | |
| 9,055,120 B1 | 6/2015 | Firman | |
| 9,106,764 B2 | 8/2015 | Chan et al. | |
| 2001/0023418 A1 | 9/2001 | Suzuki et al. | |
| 2001/0047251 A1 | 11/2001 | Kemp | |
| 2002/0065790 A1 | 5/2002 | Oouchi | |
| 2002/0087440 A1 | 7/2002 | Blair et al. | |
| 2002/0099579 A1 | 7/2002 | Stowell et al. | |
| 2002/0107673 A1 | 8/2002 | Haller et al. | |
| 2002/0152133 A1 | 10/2002 | King et al. | |
| 2003/0018490 A1 | 1/2003 | Magers et al. | |
| 2003/0069824 A1 | 4/2003 | Menninger | |
| 2003/0078846 A1 | 4/2003 | Burk et al. | |
| 2003/0139995 A1 | 7/2003 | Farley | |
| 2003/0149500 A1 | 8/2003 | Faruque et al. | |
| 2003/0163212 A1 | 8/2003 | Smith et al. | |
| 2003/0172008 A1 | 9/2003 | Hage et al. | |
| 2003/0212610 A1 | 11/2003 | Duffy et al. | |
| 2003/0220911 A1 | 11/2003 | Tompras | |
| 2004/0008876 A1 | 1/2004 | Lure | |
| 2004/0113945 A1 | 6/2004 | Park et al. | |
| 2004/0195224 A1 | 10/2004 | Kanodia et al. | |
| 2005/0055299 A1 | 3/2005 | Chambers et al. | |
| 2005/0096955 A1 * | 5/2005 | Sorensen | G06Q 10/087 705/26.4 |
| 2005/0125092 A1 | 6/2005 | Lukis et al. | |
| 2005/0144033 A1 | 6/2005 | Vreeke et al. | |
| 2005/0171790 A1 | 8/2005 | Blackmon | |
| 2005/0251478 A1 | 11/2005 | Yanavi | |
| 2005/0273401 A1 | 12/2005 | Yeh et al. | |
| 2006/0085322 A1 | 4/2006 | Crookshanks | |
| 2006/0185275 A1 | 8/2006 | Yatt | |
| 2006/0253214 A1 | 11/2006 | Gross | |
| 2007/0016437 A1 | 1/2007 | Elmufdi et al. | |
| 2007/0067146 A1 | 3/2007 | Devarajan et al. | |
| 2007/0073593 A1 | 5/2007 | Perry et al. | |
| 2007/0112635 A1 | 5/2007 | Loncaric | |
| 2007/0198231 A1 | 8/2007 | Walch | |
| 2008/0120086 A1 | 5/2008 | Lilley et al. | |
| 2008/0183614 A1 | 7/2008 | Gujral et al. | |
| 2008/0269942 A1 | 10/2008 | Free | |
| 2008/0281678 A1 | 11/2008 | Keuls et al. | |
| 2009/0058860 A1 | 3/2009 | Fong et al. | |
| 2009/0208773 A1 | 8/2009 | DuPont | |
| 2009/0299799 A1 | 12/2009 | Racho et al. | |
| 2009/0319388 A1 | 12/2009 | Yuan et al. | |
| 2011/0040542 A1 | 2/2011 | Sendhoff et al. | |
| 2011/0047140 A1 | 2/2011 | Free | |
| 2011/0209081 A1 | 8/2011 | Chen et al. | |
| 2011/0213757 A1 | 9/2011 | Bhaskaran et al. | |
| 2012/0016678 A1 | 1/2012 | Gruber et al. | |
| 2012/0072299 A1 | 3/2012 | Sampsell | |
| 2012/0230548 A1 | 9/2012 | Calman et al. | |
| 2012/0316667 A1 | 12/2012 | Hartloff | |
| 2013/0055126 A1 | 2/2013 | Jackson et al. | |
| 2013/0097259 A1 | 4/2013 | Li | |
| 2013/0100128 A1 | 4/2013 | Steedly et al. | |

(56) References Cited

U.S. PATENT DOCUMENTS

| | | |
|---|---|---|
| 2013/0138529 A1 | 5/2013 | Hou |
| 2013/0144566 A1 | 6/2013 | De Biswas |
| 2013/0166470 A1 | 6/2013 | Grala et al. |
| 2013/0218961 A1 | 8/2013 | Ho |
| 2013/0293580 A1 | 11/2013 | Spivack |
| 2013/0297320 A1 | 11/2013 | Buser |
| 2013/0297460 A1 | 11/2013 | Spivack |
| 2013/0311914 A1 | 11/2013 | Daily |
| 2013/0325410 A1 | 12/2013 | Jung et al. |
| 2014/0042136 A1 | 2/2014 | Daniel et al. |
| 2014/0067333 A1 | 3/2014 | Rodney et al. |
| 2014/0075342 A1 | 3/2014 | Corlett |
| 2014/0098094 A1 | 4/2014 | Neumann et al. |
| 2014/0157579 A1 | 6/2014 | Chhabra et al. |
| 2014/0201019 A1* | 7/2014 | Gindlesperger ..... G06Q 10/087 705/26.3 |
| 2014/0207605 A1 | 7/2014 | Allin et al. |
| 2014/0229316 A1 | 8/2014 | Brandon |
| 2014/0279177 A1 | 9/2014 | Stump |
| 2014/0379119 A1 | 12/2014 | Sciacchitano et al. |
| 2015/0055085 A1 | 2/2015 | Fonte et al. |
| 2015/0066189 A1 | 3/2015 | Mulligan et al. |
| 2015/0127480 A1 | 5/2015 | Herrman et al. |
| 2015/0234377 A1 | 8/2015 | Mizikovsky |

FOREIGN PATENT DOCUMENTS

| | | | |
|---|---|---|---|
| WO | 171626 A2 | 9/2001 | |
| WO | 2001077781 A2 | 10/2001 | |
| WO | WO-0177781 A2 * | 10/2001 | ............. G06Q 30/06 |
| WO | 2006086332 A2 | 8/2006 | |
| WO | 2007067248 A2 | 6/2007 | |
| WO | 2011139630 A1 | 11/2011 | |
| WO | 2011140646 | 11/2011 | |
| WO | 2013058764 A1 | 4/2013 | |
| WO | 2014152396 A2 | 9/2014 | |

OTHER PUBLICATIONS

Defining Lead Time for APS Planning; http://t3.apptrix.com/syteline/Language/en-US/Other/Process/Defining_Lead_Time.htm [online][retrieved Mar. 31, 2017].

"Quartiles." Mathisfun.com. Web. <https://www.mathsisfun.com/data/quartiles.html>. Archive. <https://web.archive.org/web/20170313183511/https://www.mathsisfun.com/data/quartiles.html> [online] [retrieved Mar. 31, 2017].

Wu et al. Interactive 3D Geometric Modelers with 2D UI, 2002, State University of Campinas, www.dca.fee.unicamp.br, Sao Paulo, Brazil; 2002, 8 pages.

"Upload Your Photos, Print a 3D Model with hypr3D." SolidSmack. http://www.solidsmack.com/cad-design-news/hypr3d-photo-video-3d-print/; last accessed on Oct. 13, 2015.

"123D Catch." Autodesk. http://apps.123dapp.com/catch/ [online] [retrieved Mar. 31, 2017].

Rothganger et al. "3D Object Modeling and Recognition from Photographs and Image Sequences." Toward Category-Level Object Recognition. 2006, pp. 105-126, vol. 4170 of the series Lecture Notes in Computer Science. Springer Berlin Heidelberg.

Dealer Information Systems Corporation. "Parts Inventory." http://dis-corp.com/content/agriculture/inventory/parts-inventory. [online] [retrieved Mar. 31, 2017].

EMachineShop. "Emachineshop Features." http://www.emachineshop.com/machine-shop/Features/page518.html. [online] [retrieved Mar. 31, 2017].

Retrieved from:http://www.solidworks.com/sw/products/3d-cad/manufacturing-cost-estimation-quoting.htm p. 1: Automatic Manufacturing Cost Estimation Overview; Solidworks; 2015.

Retrieved from: http://www.gom.com/fileadmin/user_upload/industries/touch_probe_fixtures_EN.pdf; Application Example: Quality Control, Online Calibration and Validation of Fixtures, Jigs and Gauges. GOM mbH, 2008.

http://citeseerx.ist.psu.edu/viewdoc/download?doi=10.1.1.194.7785&rep=rep1&type=pdf Kim, Jin Baek, and Arie Segev. "A web services-enabled marketplace architecture for negotiation process management." Decision Support Systems 40.1 (2005): 71-87.

Jaiswal, Ashutosh et al., "Design and Implementation of a Secure Multi-Agent Marketplace", Elsevier Science, pp. 1-23, Jun. 3, 2004; http://magnet.cs.umn.edu/papers/Jaiswal04cera.pdf.

http://www.computer.org/csdl/proceedings/hicss/2005/2268/01/22680038.pdf Bui, Tung, and Alexandre Gachet. "Web services for negotiation and bargaining in electronic markets: Design requirements and implementation framework." System Sciences, 2005. HICSS'05. Proceedings of the 38th Annual Hawaii International Conference on. IEEE, 2005.

http://www.bridgelinedigital.com/File%20Library/Repository/eCommerce/Sample-eCommerce-RFP-Template_Bridgeline-Digital.pdf. Sample RFP Template: Ecommerce Platform, Bridgeline Digital, 2014.

Matchbook, Tealbook, http://www.matchbookinc.com/ Sep. 28, 2015.

3Diligent, Source Smarter, http://www.3diligent.com/customer.html; Sep. 28, 2015.

Dassault Systemes, Brochure, Mar. 24, 2010: New Features Type3ToCatia http://www.type3.us/content/download/2202/405535/file/New%20Feature_Type3ToCatia_2010 _US%20old.pdf.

Xue, S., X. Y. Kou, and S. T. Tan. "Natural voice-enabled CAD: modeling via natural discourse." Computer-Aided Design and Applications 6.1 (2009): 125-136.

Kou, X. Y., S. K. Xue, and S. T. Tan. "Knowledge-guided inference for voice-enabled CAD." Computer-Aided Design 42.6 (2010): 545-557.

Sharma, Anirudh, et al. "MozArt: a multimodal interface for conceptual 3D modeling." Proceedings of the 13th international conference on multimodal interfaces. ACM, 2011.

Sorpas ("User Manual,", Swanted Software and Engineering Aps, 2011 (120 pages)).

Kalpakjian, S. and Schmid, S., *Manufacturing Processes for Engineering Materials*, 5$^{th}$ Ed. Pearson (Jul. 27, 2007).

Wang and Bourne, *Design and Manufacturing of Sheet Metal Parts: Using Features to Aid Process Planning and Resolve Manufacturability Problems*, Robotics and Computer-Integrated Manufacturing, vol. 13, No. 3, pp. 281-294 (1997).

U.S. Appl. No. 14/267,447, Aug. 5, 2015, Office Action.
U.S. Appl. No. 14/197,922, Nov. 26, 2014, Office Action.
U.S. Appl. No. 14/197,922, Apr. 27, 2015, Response to Office Action.
U.S. Appl. No. 14/197,922, May 15, 2015, Office Action.
U.S. Appl. No. 14/267,447, Jun. 18, 2015, Response to Office Action.
U.S. Appl. No. 14/263,665, Oct. 8, 2015, Office Action.
U.S. Appl. No. 14/053,222, Jan. 29, 2016, Office Action, now U.S. Pat. No. 9,606,701.
U.S. Appl. No. 14/311,943, Apr. 27, 2016, Office Action.
U.S. Appl. No. 14/486,550, May 26, 2016, Office Action.
U.S. Appl. No. 14/060,033, Jun. 15, 2016, Office Action.
U.S. Appl. No. 14/172,462, Jul. 6, 2016, Office Action.
U.S. Appl. No. 14/053,222, Jul. 29, 2016, Response to Office Action.
U.S. Appl. No. 14/185,204, Jul. 29, 2016, Office Action.
U.S. Appl. No. 14/062,947, Sep. 16, 2016, Office Action.
U.S. Appl. No. 14/457,758, Sep. 30, 2016, Office Action.
U.S. Appl. No. 14/457,758, Mar. 29, 2017, Response to Office Action.
U.S. Appl. No. 14/195,391, Oct. 18, 2017, Office Action.
U.S. Appl. No. 14/172,404, Oct. 20, 2017, Office Action.
U.S. Appl. No. 14/275,116, Dec. 28, 2016, Office Action.
U.S. Appl. No. 14/303,372, Jan. 11, 2017, Office Action.
U.S. Appl. No. 14/246,254, Jan. 11, 2017, Office Action.
U.S. Appl. No. 14/229,008, Jan. 13, 2017, Office Action.
U.S. Appl. No. 14/060,033, filed Oct. 22, 2013.
U.S. Appl. No. 14/053,222, filed Oct. 14, 2013, U.S. Pat. No. 9,606,701.
U.S. Appl. No. 14/172,462, filed Oct. 16, 2013.
U.S. Appl. No. 14/062,947, filed Oct. 25, 2013.
U.S. Appl. No. 14/172,404, filed Feb. 4, 2014.

(56) References Cited

OTHER PUBLICATIONS

U.S. Appl. No. 14/303,372, filed Jun. 12, 2014.
U.S. Appl. No. 14/185,204, filed Feb. 20, 2014.
U.S. Appl. No. 14/195,391, filed Mar. 3, 2014.
U.S. Appl. No. 14/246,254, filed Apr. 7, 2014.
U.S. Appl. No. 14/229,008, filed Mar. 28, 2014.
U.S. Appl. No. 14/197,922, filed Mar. 5, 2014.
U.S. Appl. No. 14/263,665, filed Apr. 28, 2014.
U.S. Appl. No. 14/267,447, filed May 1, 2014.
U.S. Appl. No. 14/311,943, filed Jun. 23, 2014.

* cited by examiner

ELECTRONIC PRICING MACHINE CONFIGURED TO GENERATE PRICES BASED ON SUPPLIER WILLINGNESS AND A USER INTERFACE THEREFOR

RELATED APPLICATION DATA

This application claims the benefit of priority of U.S. Provisional Patent Application Ser. No. 62/312,165, filed on Mar. 23, 2016, and titled "ELECTRONIC PRICING MACHINE CONFIGURED TO GENERATE PRICES BASED ON SUPPLIER WILLINGNESS AND A USER INTERFACE THEREFOR," which is incorporated by reference herein in its entirety.

FIELD OF THE INVENTION

The present invention generally relates to the field of structure fabrication. In particular, the present invention is directed to an electronic pricing machine configured to generate prices based on supplier willingness and a user interface therefor.

BACKGROUND

Presently, computer-aided design (CAD) programs allow designers to create computer models of products to be manufactured. After a design is complete, the designer typically then seeks out one or more suppliers to which they may send one or more design specifications and requests for price (RFPs) in order to obtain one or more prices (e.g., quotes or bids) for fabricating the designed structure. Designers typically manually submit design specifications to each supplier from which they wish to receive a bid. However, identifying suppliers that are not only capable but also willing to fabricate particular structures, can cost the designer significant effort, time, and money.

SUMMARY OF THE DISCLOSURE

In an implementation, the present disclosure is directed to a method performed by a computing system communicating with at least one client device across a network. The method may include: providing automated costing software to the computing system to transform at least part of the computing system into an electronic pricing machine, wherein the automated costing software includes an interrogation engine, a willingness engine, and a pricing engine; receiving from a price requestor, by the electronic pricing machine via the at least one client computer and the network, an electronic RFP associated with CAD model data representing a structure; in response to receiving the RFP, automatically running, by the electronic pricing machine, the interrogation engine to interrogate the CAD model data to determine and store in memory structure parameters, to compare to parameters of a possible supplier to determine whether or not the possible supplier is capable of and/or willing to supply one or more instantiations of the structure; automatically generating, by the electronic pricing machine, a price/no-price determination of whether or not the possible supplier will provide a price to the price requestor, wherein the generating includes running, by the electronic pricing machine, the willingness engine to automatically compare one or more of the supply parameters to one or more stored willingness limitations of the possible supplier so as to determine whether or not the one or more supply parameters satisfy the one or more willingness limitations; based on the price/no-price determination, either 1) running, by the electronic pricing machine, the pricing engine to generate a price or 2) not running, by the electronic pricing machine, the pricing engine; and when the electronic pricing machine generates the price, providing, by the electronic pricing machine and to a user interface via the network, the price for viewing of the price requestor on the user interface.

In another implementation, the present disclosure is directed to a user interface for an electronic pricing machine designed and configured to allow a supplier to provide a price in response to a RFP from a price requestor for supplying one or more instantiations of a structure represented by CAD model data, wherein an interrogator is configured and used to extract from the CAD model data 1) objective fabrication parameters pertaining to objective supplier capabilities and 2) supplier willingness parameters pertaining to supplier fabrication willingness. The user interface may include: an objective capabilities graphical user interface (GUI) designed and configured to: prompt a supplier representative to input objective capabilities information corresponding to the objective fabrication parameters that the interrogator is designed and configured to extract from the CAD model data when present, wherein the objective capabilities GUI includes a plurality of capabilities input features designed and configured for inputting corresponding differing types of objective capabilities information; and store the inputted objective capabilities information in an objective capabilities datastore; and a willingness GUI designed and configured to: prompt the supplier representative to input desired willingness limitations corresponding to the supplier willingness parameters that the interrogator is designed and configured to extract from the CAD model data when present, wherein the willingness GUI includes a plurality of willingness input features designed and configured for inputting corresponding differing types of willingness limitations; and store the inputted willingness limitations in a willingness limitations datastore.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
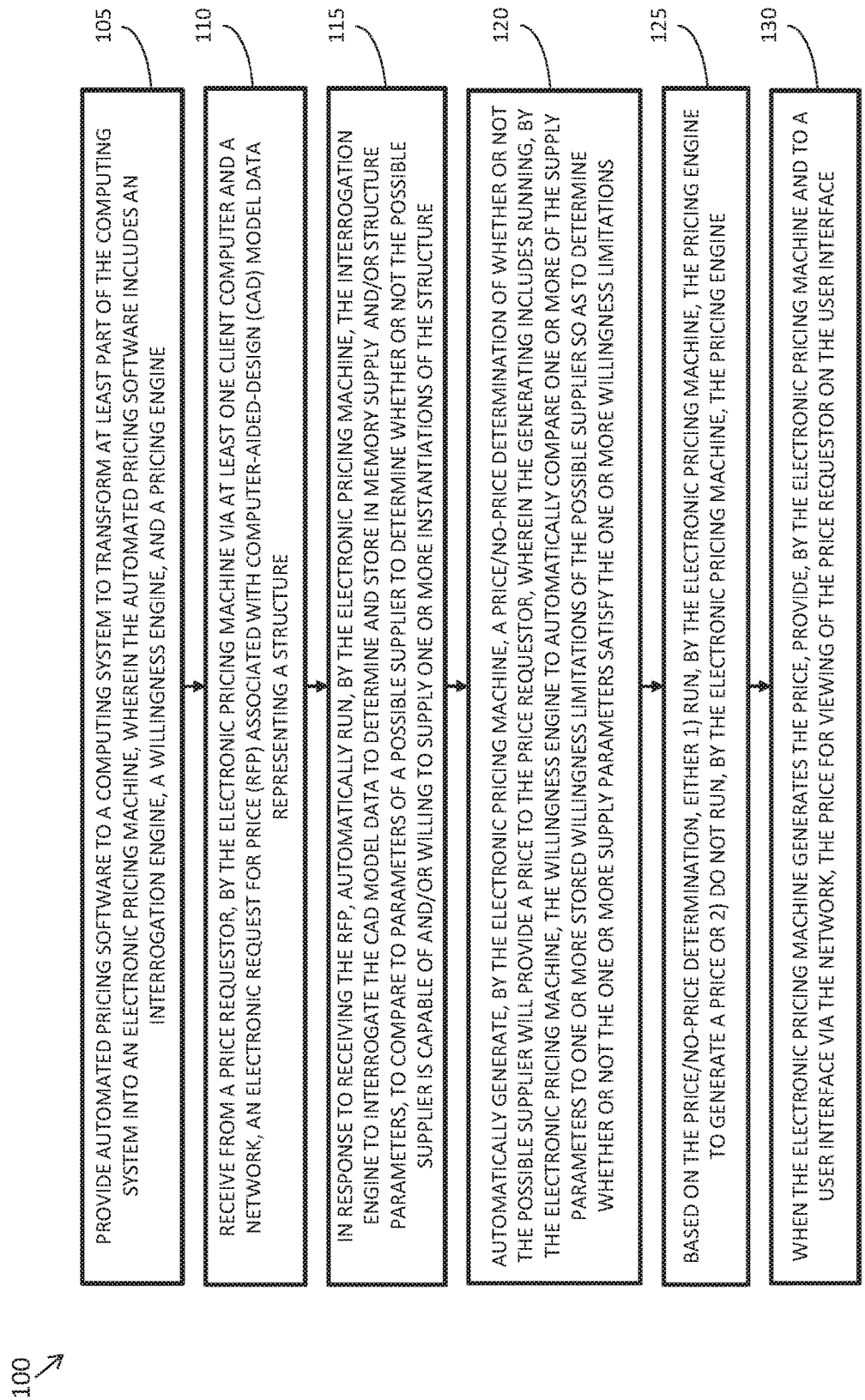
FIG. 1 is a flow diagram illustrating an exemplary method of facilitating supplier willingness awareness in a marketplace of suppliers.

Aspects of the present disclosure include methods and software for facilitating supplier willingness awareness in a marketplace of suppliers of structures represented and/or specified in a design. Examples of structures that may be specified and/or represented in a design include machined metal parts, electronic-device chasses formed from sheet metal, articles of clothing, and assemblies of various parts such as a vehicle, among a virtually limitless number of other structures. In some embodiments, methods and software of the present disclosure allow each of any one or more designers participating in an automated marketplace to view a list of suppliers that are willing to fabricate a particular design such that the designers can quickly and easily identify suppliers that are not only capable of fabricating particular designs but also willing to do so. Such a list may be generated by comparing a list of objective requirements for a design, which may be generated, for example, from fabrication data associated with a price requestor's RFP and/or CAD file, to willingness data associated with one or more suppliers.

As would be apparent to one reasonably skilled in the art, aspects of the present disclosure may be applied to other manufacturing types, including but not limited to the manufacture of apparel. Both sheet metal and apparel designers use CAD systems to design their products, typically using sheets of flat material for manufacture. Design data, such as material choice, precise dimensions, and locations of additional features may be embedded within the digital design. Designers may choose different metals or fabrics (including non-woven materials such as leather) depending on the strength and other inherent properties of the material, affecting which manufacturing methods may be necessary to work the material. Purchased components (in some cases, identical purchased components) may be added to the design. CAD programs may be used to visualize the shape of the finished product. In both sheet metal and apparel manufacturing the sheet (metal or fabric) may be cut or stamped by a variety of methods using computerized machines. Units are moved from station to station during manufacture. Where sheet metal is connected by rivets or welding, sheet fabric is connected by stitching or gluing. Surface finishes may be applied to both; both may be painted, silk-screened, or otherwise covered with a protective substance.

As alluded to above, in some embodiments designers or other price requestors can provide an RFP or CAD file representing and/or specifying a design to software designed and configured according to the present disclosure, which may then generate a list of suppliers willing to fabricate the design. This functionality can reduce the amount of effort, time, and money designers typically must spend to identify suppliers that are willing to fabricate particular structures. In order to provide such functionality, the software may be implemented in an automated marketplace system accessible by price requestors (e.g., designers, purchasing agents, etc.) and price providers (e.g., suppliers and third-party contractors of suppliers, etc.). Price requestors may submit design specifications directly to the marketplace via, for example, an Internet browser or indirectly through a CAD program or other system capable of interfacing with the marketplace and communicating designs thereto, and may cause the marketplace to generate a list of suppliers willing to fabricate their design(s).

Figure 2:
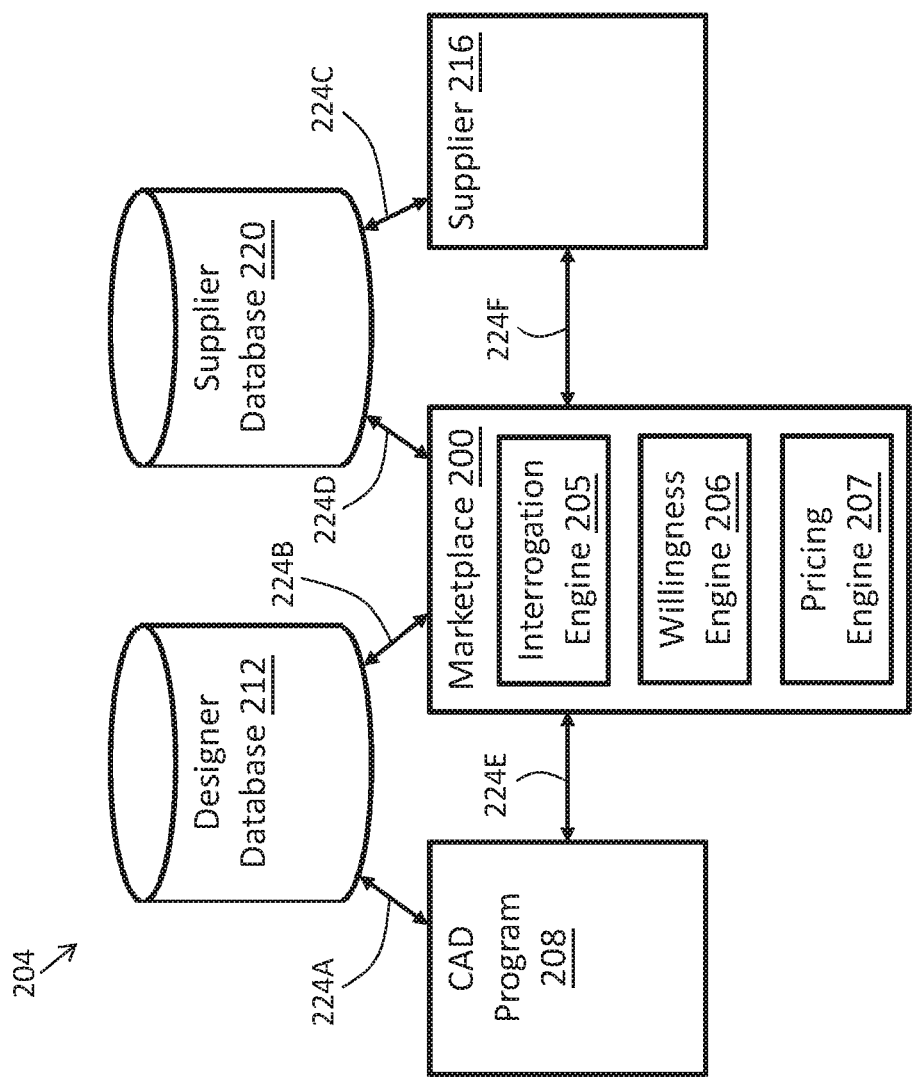
FIG. 2 is a high-level block diagram illustrating an exemplary automated marketplace system that may be used to implement the method of FIG. 1.
Figure 3:
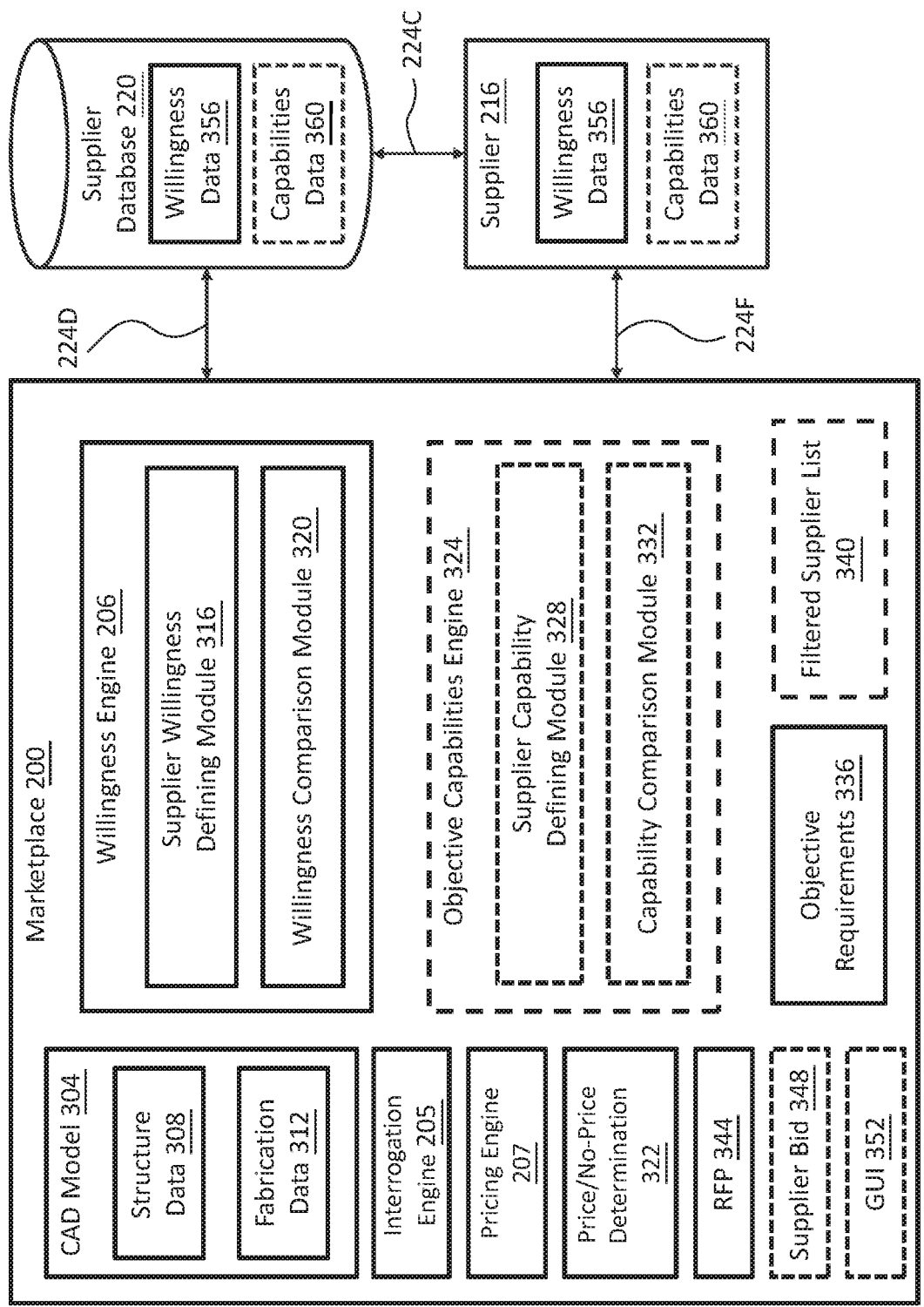
FIG. 3 is a block diagram illustrating details of an exemplary embodiment of the marketplace system of FIG. 2.
Figure 6:
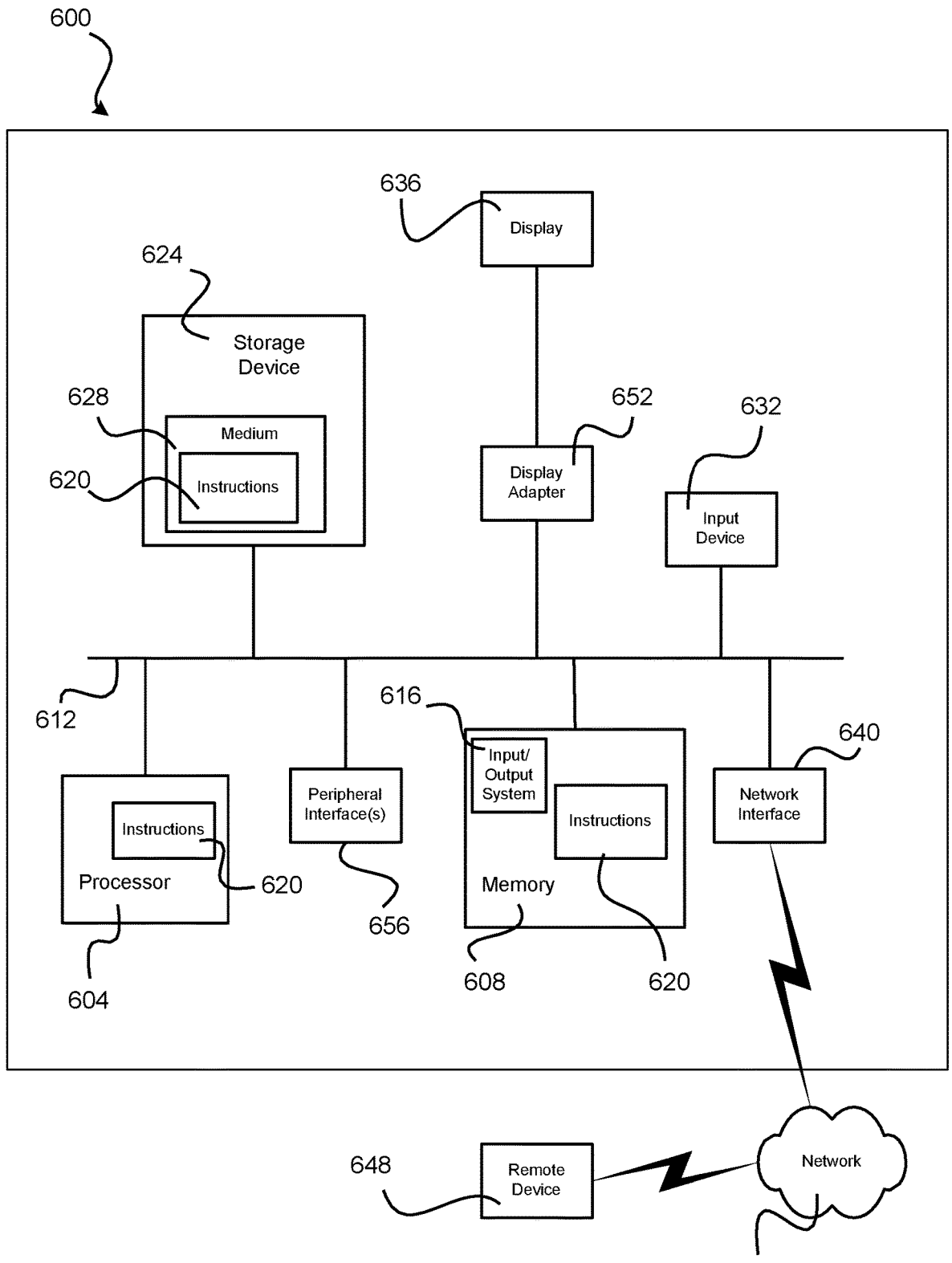
FIG. 6 is a block diagram of a computing system that can be used to implement any one or more of the methodologies disclosed herein and any one or more portions thereof.

Turning now to the drawings, FIG. 1 illustrates an exemplary method 100 of facilitating the generation of a list of suppliers willing to fabricate one or more physical instantiations of one or more designs. Method 100 may be implemented in a marketplace, such as in exemplary electronic marketplace 200 within automated marketplace system 204 of FIG. 2, using a computing system, such as computing system 600 of FIG. 6 or a network of such or similar computing systems (e.g., a wide-area network, a global network (such as the Internet), and/or a local area network, among others), that is generally: 1) programmed with instructions for performing steps of a method of the present disclosure; 2) capable of receiving and/or storing data necessary to execute such steps; and 3) capable of providing any user interface that may be needed for a user to interact with the automated marketplace, including setting the system up for supplier willingness analysis and viewing one or more lists of suppliers and/or associated prices that are produced, among other things. Those skilled in the art will readily appreciate that aspects of the present disclosure can be implemented with and/or within any one or more of numerous devices, ranging from self-contained devices, such as a smartphone, tablet, computer, laptop computer, desktop computer, server, or web-server, to a network of two or more of any of these devices. Fundamentally, there is no limitation on the physical construct of the automated marketplace, as long as it can provide one or more of the features and functionality described herein. In some embodiments, depending on specific implementation, one or more steps of method 100 and/or any other method(s) incorporating features/functionality disclosed herein may be implemented substantially in real-time. FIGS. 2, 3, and 6, described more fully below, illustrate aspects of an exemplary automated marketplace system 204 (FIGS. 2 and 3) and computer system 600 (FIG. 6) that can be used to implement various steps of method 100 and/or any other method incorporating features/functionality disclosed herein.

Method 100 may begin at step 105, in which automated costing software may be provided to a computing system, such as a computing system or component thereof represented in any one or more of FIGS. 2, 3, and 6, to effectively transform at least part of the computing system into an electronic pricing machine. Such software may be provided to marketplace 200, as illustrated in FIG. 2, but may additionally or alternatively be provided to any other device capable of performing the necessary hardware to execute the software. As further described hereinbelow, the software may include an interrogation engine 205 for evaluating one or more CAD files to determine capabilities that a supplier may need to meet in order to fabricate one or more structures associated with such CAD files, a willingness engine 206 for identifying suppliers willing to fabricate such structures, and a pricing engine 207 for pricing the structures and/or orders associated with such structures.

In step 110, the electronic pricing machine created at step 105, which may be part of marketplace 200 of FIG. 2 in an embodiment, may receive from a price requestor, via at least one client computer and a network, an electronic RFP associated with CAD model data representing a structure. A designer or other price requestor may provide such an RFP, which may include fabrication data for the structure, to marketplace 200 via, for example, a CAD program, such as a CAD program 208, although various other clients may be used, such as website interfaces, dedicated applications, or email interfaces, among others. Alternatively, processes described in the instant application may proceed without receiving an electronic RFP. Those of skill in the art will readily appreciate after reading this disclosure in its entirety that these processes may proceed without receiving an RFP.

In step 115, in response to receiving the RFP, marketplace 200 may automatically, or in response to a user input, such as selection of a user interface element, run interrogation engine 205 to interrogate the CAD model data to determine and store in memory supply or structure parameters, to compare to parameters of a possible supplier to determine whether or not the possible supplier is capable of and/or willing to supply one or more physical instantiations of the structure. For example, such supply parameters may comprise a list of objective requirements for fabricating a structure associated with the RFP and may be generated using fabrication data associated with the RFP. Such objective requirements may specify baseline capabilities that suppliers must possess in order to be able to successfully fabricate the structure and may include, for example, a maximum dimension of the structure, a material required for the structure, finishing needs, required tolerances, extrapolated machine type(s), and/or a quantity of parts and/or structures, among others, as further described herein. The objective requirements may be generated by analyzing the fabrication data associated with the RFP to determine such information (maximum dimensions, materials, finishing needs, required tolerances, machine type(s), quantity, etc.). In an embodiment the CAD model may be constantly interrogated (running in the background) to establish a list of suppliers before an RFP is received and then when a RFP is received, having a narrowed supplier list to query for a cost. Alternatively, or additionally, a user may input parameters. For example, a user may input a quantity.

Next, in step 120, marketplace 200 may automatically generate a price/no-price determination of whether or not the possible supplier will provide a price to the price requestor, which may include running willingness engine 206 to automatically compare one or more of the supply parameters to one or more stored willingness limitations of the possible supplier so as to determine whether or not the one or more supply parameters satisfy the one or more willingness limitations. Such willingness limitations may be stored in marketplace 200 and/or received from one or more suppliers, for example. The price/no-price determination generated in step 120 indicates whether or not the electronic pricing machine will provide a calculated price to the price requestor.

Based on the price/no-price determination, in step 125 marketplace 200, if the determination is positive, i.e., that the electronic pricing machine should provide a price, 1) runs pricing engine 207 to generate a price; or, if the determination is negative, i.e., that the electronic pricing machine should not provide a price, 2) does not run the pricing engine. In some embodiments, marketplace 200 may generate one or more filtered supplier lists as a function of the comparison performed at step 120. Such filtered supplier lists may include one or more suppliers that possess capabilities meeting or exceeding the objective requirements generated at step 115 and that are thus capable of fabricating the structure associated with the RFP. Such a filtered supplier list may include, for example, a list of those suppliers capable of, for example: fabricating structures having dimensions equal to or greater than the maximum dimensions of the structure associated with the RFP, working with materials required for the structure associated with the RFP, and/or applying plating required for the structure associated with the RFP, among others, as described further hereinbelow. Additionally or alternatively, a filtered supplier list may include suppliers determined to both have the capability and willingness to fabricate structures associated with a particular RFP, as determined at step 120.

If and when the electronic pricing machine generates the price, in step 130, marketplace 200 may provide the price for viewing of the price requestor on a user interface via the network. Notably, as will be appreciated by those of ordinary skill after reading this disclosure in its entirety, the user interface used to provide an RFP and the user interface used to view the price need not be the same. For example, a user may provide an RFP through an interface on a mobile phone and view the resulting price through an interface on a smart television, and any other user interfaces and hardware platforms may be used as desired provided that the hardware platforms are capable of running such interfaces. After reviewing one or more prices, the price requestor may then accept one or more of the prices via one or more user interfaces, which will result in the supplier(s) fabricating the structures associated with the associated RFP.

As briefly mentioned above, FIG. 2 illustrates an exemplary automated marketplace system 204 in which method 100 of FIG. 1 may be implemented. Marketplace system 204 enables one or more designers to post RFPs associated with one or more designs and/or structures to a marketplace, here electronic marketplace 200, via a CAD program and/or designer database, such as CAD program 208 and/or designer database 212, although other clients may be used as described above. Marketplace 200 may be accessible by one or more suppliers, such as supplier 216, that may automatically, either directly or via marketplace 200, review designs and place bids on the work associated with the creation of one or more designs or structures associated with an RFP by interacting with, for example, an in-house supplier program and/or a supplier database, such as supplier database 220, although other clients may be used for this purpose as well. Marketplace 204 may include software that enables communication between/among designers, suppliers, and/or others and may comprise, for example, one or more stand-alone or add-on programs (e.g., for use with CAD program 208 or other programs), one or more web sites, a distributed or decentralized network, and/or a peer-to-peer network, among other known types of networks, servers, clients, and programs/add-ons, as well as various data connections 224A to 224F, as appropriate. Notably, in some embodiments, marketplace 200 may implement all of the steps of method 100 of FIG. 1, though in other embodiments other components, such as a marketplace client, add-on program, or dedicated application, among others, which a supplier, designer, price requestor, or third-party user may provide and/or execute, may implement one or more steps.

In use, a designer or other price requestor may upload or otherwise communicate one or more RFPs associated with fabrication data for a structure to marketplace 200. In some embodiments, as noted above, a designer or other price requestor may interact with marketplace 200 via CAD program 208, which may comprise a plurality of programs/websites and/or a single program or website and may be augmented with non-CAD programs such as, for example, a marketplace client. Designers may use CAD program 208 to design virtual computer models and/or to generate data, such as one or more RFPs, to send to marketplace 204 and/or a designer database 212. For example, a designer may upload an RFP including information associated with a CAD model design from CAD program 208 to designer database 212, which may then communicate the information or otherwise make the information available to marketplace 200. In some embodiments, CAD program 208 may communicate directly with marketplace 200 rather than or in addition to communicating with the marketplace via designer database 212. One or more suppliers, such as supplier 216, may then interact or may have previously interacted with marketplace 200 to cause it to respond to the RFP by placing bids on one or more designs included in or otherwise accessible by the marketplace. The designers or other price requestors may view and/or filter such bids or all suppliers associated with system 204 who have both the capability and the willingness to provide such bids by utilizing method 100 via, for example, marketplace 200 and/or CAD program 208.

As mentioned above, system 204 may include a designer database 212. Designer database 212 may store information associated with a design, such as a design generated in a CAD program 208, and may reside, for example, on a server, a hard drive, a CD, a flash drive, and/or cloud storage, among other known data storage devices/services. In some embodiments, designer database 212 may comprise two or more datastores and may include design and/or designer information such as design fabrication specifications and/or documents, CAD files, design images, RFPs, materials, quantities, need dates, and/or shipping addresses, among others.

Supplier 216 or a third party contracted thereby, may be one or more entities that bid on and/or fabricate one or more parts and/or structure(s) posted by one or more price requestors and may be, for example, a manufacturer of sheet metal parts, a manufacturer of machines parts, a manufacturer of assemblies, or a manufacture of clothing, among others. System 204 may include a supplier program similar or equivalent to CAD program 208 for allowing a supplier or other to generate price data to be sent to a marketplace and for receiving various data, such as bidding and designer information, from the marketplace and/or accepting/reviewing bids, among other things. Such a supplier program may comprise a plurality of programs/websites and/or a single program or website and may be accessible by one or more supplier 216, among other implementations that will become readily apparent to one of ordinary skill after reading this disclosure in its entirety. In some embodiments, one or more supplier and/or supplier programs may communicate directly with marketplace 200 rather than or in addition to communicating with the marketplace via supplier database 220.

System 204 may utilize supplier database 220 for storing information associated with bids from one or more suppliers, such as one or more bids placed by one or more suppliers, a current winning bid, and/or supplier information such as supplier location, capabilities data, willingness data, equipment data, etc. In some embodiments, system 204 may include an equipment parameter database (not shown), which may be included in one or more components of the system and may specify equipment available to one or more suppliers. Such an equipment parameter database may be interrogated by one or more components of system 204, such as interrogation engine 205 and/or willingness engine 206 of marketplace 200, among others, optionally as a function of equipment data for one or more suppliers in order to identify one or more parameters, such as a geometric limit or capability, associated with the one or more suppliers' available equipment. As with designer database 212, supplier database 220 may reside, for example, on a server, a hard drive, a CD, a flash drive, and/or cloud storage, among other known data storage devices/services. In some embodiments, supplier database 220 may comprise two or more datastores.

System 204 further provides a number of data connections to enable communication between various portions thereof. The system may implement these connections in the form of, for example, an Internet connection, a local network connection, and/or any other suitable connection between electronic devices or portions of one or more devices. For example, system 204 may provide a design specifications data link 224A between CAD program 208 and designer database 212 that may transmit the contents of designs, design specifications, RFPs, and/or designer information from CAD program 208 to storage within designer database 212. System 204 may also provide a design input data link 224B between designer database 212 and marketplace 200 that may allow new bids, design details, etc., to be stored within designer database 212, as well as allowing design information, RFPs, etc., to be loaded into marketplace 200 from the designer database, which may be performed, for example, upon the accessing of the marketplace by a designer or supplier, whenever changes occur in or data is added to the database, or at any other appropriate time.

System 204 may further provide a supplier upload data link 224C between supplier 216 and supplier database 220 that may transmit bids, capability data, willingness data, etc., from the supplier and/or a supplier program to storage within the supplier database. System 204 may additionally provide a supplier bid data link 224D between supplier database 220 and marketplace 200 that may allow new bids, design details, RFPs, etc., to be stored within the supplier database, as well as allowing bids to be loaded into marketplace 200 from supplier database 220, which may be performed, for example, upon the accessing of the marketplace by a designer or supplier, whenever changes occur in or data is added to the database, or at any other appropriate time. System 204 may also include a data link 224E between marketplace 200 and CAD program 208 that may transmit various bidding and supplier information from the marketplace to the CAD program and/or design information, RFPs, etc., to the marketplace from the CAD program. System 204 may further include a data link 224F between marketplace 200 and supplier 216 that may transmit various bidding and designer information, RFPs, etc., from marketplace 200 to a supplier or supplier program.

As briefly described above, interrogation engine 205 of marketplace 200 may comprise, for example, a subprogram or program module that may interrogate a CAD model to generate a list of objective requirements based on the data contained therein. In operation, a designer may upload an RFP associated with fabrication data for a structure represented in a CAD model from CAD program 208 to designer database 212, which may then communicate the information or otherwise make the information available to marketplace 200. Similarly, supplier 216 may upload or make available capabilities data and/or willingness data reflecting its manufacturing capabilities and/or willingness to supplier database 220 via supplier upload data link 224C, which may transmit or otherwise make available the capabilities data and/or willingness data to marketplace 204, either immediately or in response to a supplier, designer, or other request.

Illustrative embodiments for an interrogator like interrogation engine 205 may be found in: U.S. patent application Ser. No. 14/060,033, filed on Oct. 22, 2013, and entitled "AUTOMATED FABRICATION PRICE QUOTING AND FABRICATION ORDERING FOR COMPUTER-MODELED STRUCTURES", which is incorporated by reference herein for its teachings of extracting pricing data from computer models; U.S. patent application Ser. No. 14/282,773, filed on May 20, 2014, and entitled "METHODS AND SOFTWARE FOR ENABLING CUSTOM PRICING IN AN ELECTRONIC COMMERCE SYSTEM", which is incorporated by reference herein for its teachings of particular interrogator engines; and U.S. Patent Application Ser. No. 62/072,653, filed on Oct. 30, 2014, and titled "METHODS AND SOFTWARE FOR FACILITATING PRICING AND ORDERING OF A STRUCTURE REPRESENTED IN A COMPUTER MODEL", which is incorporated by reference herein for its teachings of various interrogation engines and related functionality.

In some embodiments, an interrogator, such as interrogation engine 205, may parse and/or analyze a CAD model to identify separate elements thereof by reading a combination of (a) specific commands issued by a CAD system and (b) specific routines or functions associated with such commands to determine whether they collectively define an individual element or portion (a "shape," "solid body," or "component") of a CAD model. Many CAD systems, including, by way of example, the SOLIDWORKS® CAD system (registered trademark of Dassault Systemes), include an application program interface (API) to enable a user to control the issuance of customized routines or functions associated with such commands. Interrogation engine 205 may read such commands, routines, and functions to determine whether they define an individual shape, and, if so, may analyze various geometric aspects of the defined shape to determine whether such aspects correspond to one or more manufacturing requirements for a product to be manufactured based on a CAD model. If so, such requirements may be output from interrogation engine 205 as CAD data, interrogation data, and/or objective requirements data for processing and analysis by any one or more components of the present disclosure.

As a first step, interrogation engine 205 may identify discrete shapes in a CAD model. In an embodiment based on the SOLIDWORKS® CAD system, interrogation engine 205 may read the "FeatureManager Design Tree" (an outline representation of individual shapes) to determine the number of solid bodies (or shapes) in the design. Representations of individual shapes may be found in other CAD software files, and other CAD software systems may be used. In the SOLIDWORKS® CAD system, one command usable to analyze the number of solid bodies is:
object[ ] bodies=(object[ ])part.GetBodies2((int)Const.swBodyType_e.swSolidBody, false);
and the output is a list of bodies. The foregoing code statement is listed by way of example only; other code statements or sequences could be used.

Interrogation engine 205 may then analyze geometric aspects of such identified shapes and compare such aspects to corresponding manufacturing requirements. In an embodiment, these manufacturing requirements may include given starting materials. In other words, interrogation engine 205 may determine whether a given defined shape can be manufactured from a given starting material based on one or more analyzed geometric properties of one or more identified shapes. If so, that starting material may be identified as a manufacturing option or requirement and may be included in CAD data generated by interrogation engine 205. As a result, pricing engine 207 may read prices associated with such starting materials from supplier database 220 or another location to determine, for example, a given supplier's calculated price per unit for a product to be manufactured in accordance with a CAD file.

In an embodiment, interrogation engine 205 may determine whether a defined shape may be manufactured from a sheet metal part. In general, in order to be manufactured from sheet metal, a defined shape must have a uniform thickness. As will be apparent to a person of skill in the art after reading this disclosure in its entirety, other geometric attributes may be analyzed to determine potential manufacturing requirements. By way of example, a given angle of bend may preclude use of certain starting materials. A given dimensional measurement may preclude certain starting materials. In some embodiments, different geometric properties may be compared in combination to define manufacturing requirements. For example, a given shape may have a uniform thickness (such that it could be manufactured from two different types of sheet metal, such as copper or aluminum), be 0.50 inch thick, and include bends of over 45° (which may preclude the use of a copper sheet, because various types of copper, depending, on composition, may not be bendable at 45° at a 0.50 inch thickness).

In some embodiments, in order to determine whether a given shape has a uniform thickness, interrogation engine 205 may first execute the "GetBoundingBox" SOLIDWORKS® CAD system's API command. The resulting output may be an array of X, Y and Z extents, for example:
XCorner1, YCorner1, ZCorner1
XCorner2, YCorner2, ZCorner2

In some embodiments, a part may not be oriented so that its thickness is represented by the Z dimension (i.e., the part is lying flat) but instead by a X or Y dimension. This may be the case where an interrogator needs to determine whether sheet metal can be used to fabricate the part. However, if interrogation engine 205 analyzes the x,y plane, then it may not be able to reliably identify each portion of the part that can be fabricated from sheet metal; by also analyzing the z dimension, the interrogator may reliably identify all sheet metal parts. Interrogation engine 205 may determine which dimension represents thickness by determining distance between corners. Thickness may be represented by the shortest distance, as follows:

$$\text{abs}[X\text{Corner1}-X\text{Corner2}]=\text{Variable } X$$

$$\text{abs}[Y\text{Corner1}-Y\text{Corner2}]=\text{Variable } Y$$

$$\text{abs}[Z\text{Corner1}-Z\text{Corner2}]=\text{Variable } Z$$

For this example, if Variable X has the lowest value of the three results, it may represent the thickness of a portion of the CAD model in question. If that is the case, width and length of the CAD model may then be calculated as:

$$\text{Width}=\text{abs}[Y\text{Corner1}-Y\text{Corner2}]$$

$$\text{Length}=\text{abs}[Z\text{Corner1}-Z\text{Corner2}]$$

Given these calculations, interrogation engine 205 may determine that a workpiece has a uniform thickness if all of the following statements are true: the CAD model must have at least one solid body; all of the vertexes of the solid body faces that are perpendicular to the base plane are also equal to the thickness value (Variable X in this example); no vertex edge length is less than the thickness value; and the perimeter of the top face is equal to the perimeter of the bottom face. This may be determined through the following code, which finds the perimeter for each face. The values of the faces are then compared and if they are equal, the output is true.

```
double getPerimeter(IFace2 face)
{
var edges=face.GetEdges( ) as object[ ];
double perimeter=0;
foreach (IEdge edge in edges)
if (edge !=null)
``` perimeter+=edge.GetLength(SwApp);
return perimeter;
}

The foregoing code statements are listed by way of example only; other code statements or sequences could be used. If the results are all true, the analyzed shape of the CAD model may represent a workpiece of uniform thickness. As such, interrogation engine 205 may conclude that the analyzed shape may be fabricated from a single sheet metal part. Accordingly, by way of example, "sheet metal" may be included in CAD data as a manufacturing option or requirement, which may cause pricing engine 207 to read prices for sheet metal parts (versus prices for plastics or other materials) from a supplier database or elsewhere. As a result, pricing engine 207 may determine a given supplier's calculated price per unit for a product to be manufactured in accordance with such manufacturing constraints as automatically determined by interrogation engine 205.

The "uniform thickness" determination set forth above, as well as the attendant height, length, and thickness measurements, among others, may be used to enable other comparisons between manufacturing requirements and supplier attributes. For example, once the use of a sheet metal workpiece has been confirmed as set forth above, a capabilities and/or willingness engine, such as willingness engine 206, may query stored supplier data for any one or more of length, width, thickness, or any other supplier constraints for sheet metal parts. An example of a potential supplier constraint that would be determined by the nature of the starting workpiece material is as follows. For mechanical hole punching for sheet metal parts, a press brake may form predetermined bends in a workpiece by clamping it between a matching punch and a die. A press brake may include a bed for supporting the workpiece between the punch and the die. However, press brakes cannot typically bend parts longer than the length of the bed. If a given supplier uses a press brake having a maximum bed length of eight feet, utilizing the process as set forth above, interrogation engine 205 may determine that a defined shape of a CAD model has a length of ten feet. In this case, pricing engine 207 may not calculate pricing for that supplier because that supplier is unable to meet one of the objective manufacturing requirements imposed by the CAD model. Capabilities and/or willingness engines and pricing engines may use outputs from interrogation engine 205 to determine a price and/or to determine whether various processes and/or materials are compatible with one another and/or one or more CAD models, as described herein.

It is noted that while the terms "module" and "engine" are used herein, these terms are not intended to require any particular configuration of the corresponding software code. For example, an "engine" or "module" should not be construed to mean that the software code is embodied in a discrete set of code independent of other software code. Rather, the terms "engine" and "module" are used herein merely as a convenient way to refer to the underlying functionality.

FIG. 3 illustrates an exemplary subsystem composed of marketplace 200, supplier 216, and supplier database 220 made in accordance with the present disclosure. In some embodiments, marketplace 204 may receive one or more projects posted by one or more designers and allow one or more suppliers to review, place custom bids on, and/or compete for posted projects. As indicated above, designers may utilize willingness engine 206 of marketplace 200 to generate a filtered supplier list as a function of a comparison between a list of objective requirements for fabricating a structure and willingness data of one or more suppliers. In order to enable this functionality, in one embodiment, marketplace 200, supplier 216, and supplier database 220 may include one or more of various components. For example, marketplace 200 may include one or more CAD models, such as CAD model 304, which may be imported or submitted from another location, for example, by a designer, and may be designed using any one or more appropriate CAD programs. Aspects of the present disclosure can be applied to various types of products such as machined parts, 3D printed parts, discrete parts, and assemblies of parts, among others, as will be apparent to those of ordinary skill in the art after reading this disclosure in its entirety. CAD model 304 may specify desired shapes, properties, and/or other aspects of a structure that a user may request a supplier to fabricate in accordance with such information and may further include structure data 308 and/or fabrication data 312. Structure data 308 may contain data related to the geometry, shape, material, and/or other inherent physical characteristics of a structure represented and/or specified in CAD model 304. Fabrication data 312, on the other hand, may contain data related to operations that must be undertaken in order to fabricate the structure, such as a type of electroplating process or a quantity of structures to be fabricated.

As discussed above, marketplace 200 may also include a willingness engine 206, which may include a supplier willingness defining module 316 for determining whether manufacturers are willing to fabricate structures corresponding to RFPs that require one or more particular materials or processes, among others, as further described herein. Supplier willingness defining module 316 may receive willingness data directly from suppliers, obtain such data from a supplier database such as supplier database 220, and/or act as an application program interface (API) through which such data may be provided, among other implementations that will become clear to those of ordinary skill in the art after reading this disclosure in its entirety. Marketplace 200 may further include a willingness comparison module 320 for comparing one or more portions of a structure associated with an existing RFP or information derived therefrom, such as one or more supply parameters or objective requirements, with willingness information, such as one or more willingness limitations, generated by supplier willingness defining module 316 in order to determine which suppliers are willing to fabricate particular structures. Based on the outcome of willingness comparison module 320, marketplace 200 may generate and store a price/no-price determination 322, which the marketplace may use to determine whether pricing engine 207 will generate a price for an existing RFP. Marketplace 200 may further optionally include an objective capabilities engine 324, which may comprise a supplier capability defining module 328 that may be similar in form and function to willingness defining module 316 but may define supplier capabilities instead of supplier willingness limitations. Marketplace 200 may also include a capability comparison module 332, which may be similar in form and function to willingness comparison module 320 but may compare supplier capabilities determined by supplier capability defining module 328 with an existing RFP or information derived therefrom, such as one or more supply parameters or objective requirements.

As noted above, marketplace 200 may also include an interrogation engine 205 which may comprise, for example, a subprogram or program module that may interrogate CAD model 304 and generate a list of objective requirements based on the data contained therein, such as one or more of structure data 308 and fabrication data 312. In some embodiments, interrogation engine 205 may comprise or be included as part of willingness engine 206 and/or objective capabilities engine 324; however, in some embodiments, as shown in FIG. 3, the interrogation engine may be separate from the willingness engine and objective capabilities engine and may generate data that can be used by such engines either under the control of such engines or prior to execution of such engines. Marketplace 200 may store such objective requirements generated by interrogation engine 205 in or as objective requirements 336. Supplier capability defining module 328, on the other hand, may comprise, for example, a subprogram or program module that interrogates supplier database 220 and/or supplier 216 in order to generate a list of capabilities of one or more suppliers that may be compared against one or more objective requirements 336 generated by interrogation engine 205. Capability comparison module 332 may also comprise a subprogram or program module and may compare supplier capabilities as determined by supplier capability defining module 320 with objective requirements 336 as determined by interrogation engine 205 to produce a filtered supplier list 340 of suppliers possessing capabilities that meet or exceed one, some, or all of the objective requirements generated by the interrogation engine.

Marketplace 200 may also include one or more RFPs, such as RFP 344, associated with CAD model 304 and/or fabrication data, such as fabrication data 312, for one or more structures. In some embodiments, one or more RFPs may comprise one or more CAD models and/or one or more CAD models may one or more RFPs. Marketplace 200 may optionally also include one or more supplier bids, such as supplier bid 348, which may comprise a manual or automated bid made by one or more suppliers, such as supplier 216, that may contain data identifying the supplier and/or containing a record of a communication from a supplier to the marketplace 200 containing, for example, the supplier's name, a unique ID number, and/or a proposed bid for fabricating a structure, among other information. Marketplace 200 may also optionally include a GUI 352, which may comprise a subprogram or program module, a portion of a marketplace client, or other appropriate data or tools enabling interaction between a user and the marketplace. In one example, GUI 352 may provide a representation of one or more structures and/or designs, controls for manipulating one or more designs, and/or interface elements a user may manipulate to execute various features and/or plug-ins of marketplace 200. In some embodiments, GUI 352 may display one or more structures, a list of objective requirements associated with the one or more structures, and/or a display of one or more prices associated with an RFP and/or a filtered supplier list 340.

In some embodiments, supplier 216 may optionally store willingness limitations and/or objective capabilities information of one or more suppliers as willingness data 356 and/or capabilities data 360, respectively, either or both of which may be supplied and/or maintained by the supplier and may enumerate one or more of the supplier's fabrication capabilities. Additionally or alternatively, supplier database 220 may store willingness data 356 and/or capabilities data 360, which may comprise one or more copies of information contained in capabilities data 348 and in some embodiments may be generated by marketplace 200 or a third party without requiring any interaction from suppliers, such as supplier 216, beyond placing bids on RFPs. In one example, marketplace 200 may generate and/or estimate willingness data 356 and/or capabilities data 352 as a function of one or more bids placed by one or more suppliers on particular RFPs. In some embodiments, willingness data 356 and/or capabilities data 360, may be modified by marketplace 200 in order to correct errors or misstatements or to reflect customer feedback.

Figure 4:
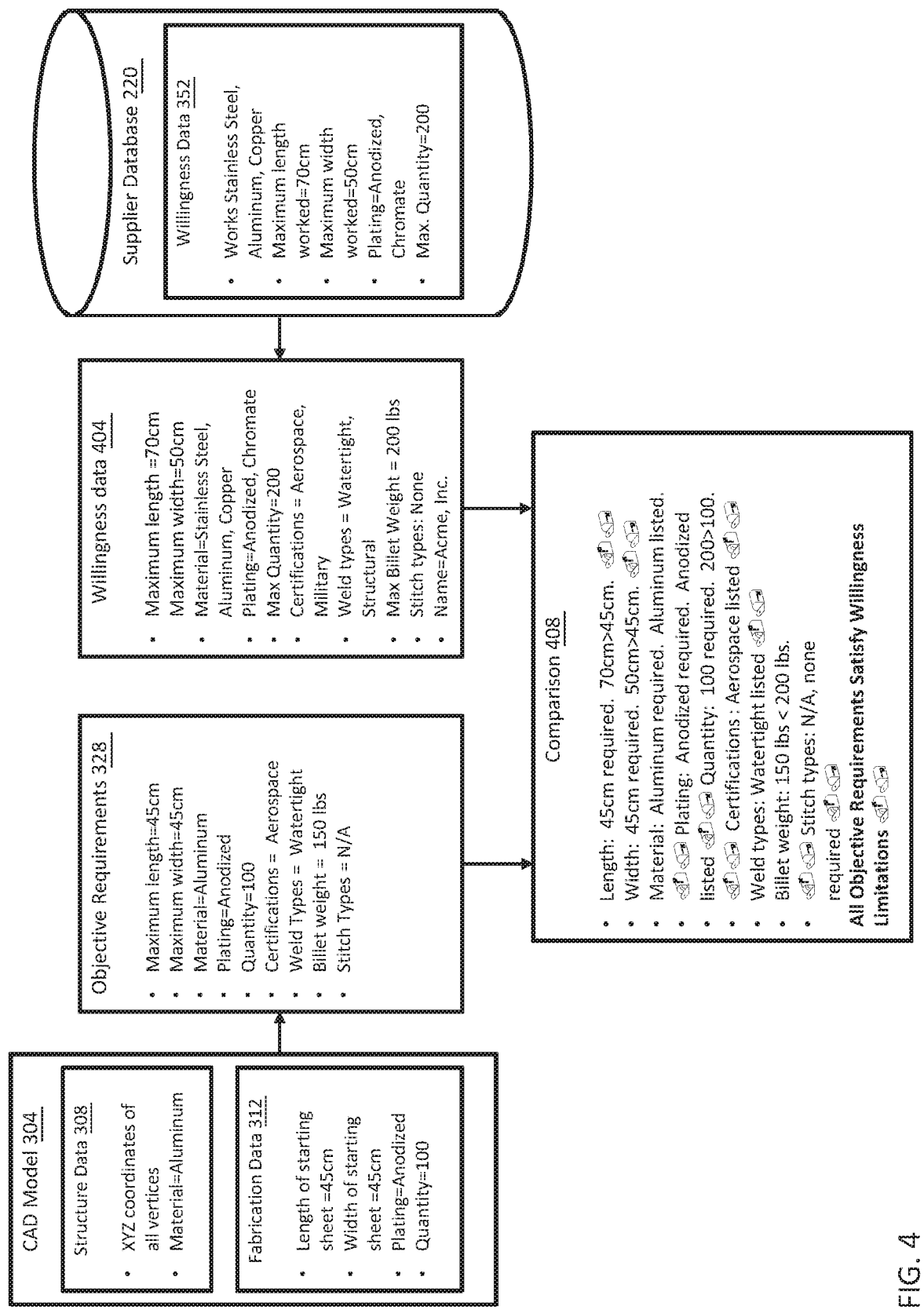
FIG. 4 is a functional diagram illustrating an example of data flow in the marketplace system of FIGS. 2 and 3.

FIG. 4 illustrates an example of data flow in a marketplace system made in accordance with the present disclosure. As alluded to above and indicated in FIG. 4, interrogation engine 205 may derive objective requirements 336, which may be stored in marketplace 200 of system 204 of FIGS. 2 and 3, from data contained in structure data 308 and/or fabrication data 312 of CAD model 304. As indicated in FIG. 4, such objective requirements 328 may include, for example, specifications indicating a maximum length that must be worked (here, 45 cm), a maximum width that must be worked (here, 45 cm), one or more required materials (here, aluminum), one or more platings to be applied (here, anodized plating), a quantity desired (here, one hundred units), a required certification (here, aerospace), one or more weld types (here, watertight), a required billet weight (here, 150 lbs.), and a required stitch type (here, not applicable), among others. Similarly, supplier willingness defining module 316 and/or supplier capability defining module 328 may receive and/or derive willingness data 404 and/or capabilities data from data contained in willingness data 356 and/or capabilities data 360.

As also illustrated in FIG. 4, willingness data 404 may include, for example, a name of a Supplier (here, Acme, Inc.), a maximum length that the supplier is willing to fabricate (here, 70 cm), a maximum width that the supplier is willing to fabricate (here, 50 cm), one or more materials with which the supplier is willing to work (here, stainless steel, aluminum, or copper), one or more platings that the supplier is willing to add (here, anodized or chromate), a minimum or maximum quantity that the supplier is willing to fabricate (here, a maximum of two hundred units), any certifications the supplier may be willing to provide (here, aerospace and military), weld types the supplier is willing to provide (here, watertight and structural), a max billet weight the supplier is willing to work with (here, 200 lbs.), and stitch types the supplier is willing to use (here, none). Willingness data 404 may be stored as willingness data 356, for example, in one or more of supplier database 220, marketplace 200, and/or in any other appropriate location in system 204. Comparison 408 illustrates an exemplary comparison that willingness comparison module 320 of willingness engine 206 may perform as part of step 120 of method 100. As shown, comparison 408 involves a like-to-like comparison of objective requirements 328 and willingness data 404. Here, all objective requirements 328 are met or exceeded by willingness data 404, as indicated by the check mark next to each sub-comparison (length, width, material, etc.) listed in comparison 408.

Notably, a similar comparison can be performed for supplier capabilities using capability comparison module 332 in addition to or as an alternative to the willingness comparison described above. However, a supplier's willingness to fabricate a structure is often more important than a supplier's capability to do so. For example, a supplier may be willing to hire a subcontractor to fabricate parts that the supplier is not capable of manufacturing themselves. As another example, a supplier may be capable of manufacturing aerospace grade parts but may not have the insurance necessary to certify the parts as such or may simply be unwilling to certify the parts despite having the requisite insurance. In the case of watertight welds, some suppliers may be capable of performing such welds but may not have the testing equipment and/or have enough experienced workers to supply structures comprising such welds and may not be willing to make investments that may be required to provide structures comprising such welds reliably and/or profitably. Many types of weights can be taken into account (per structure or per shipment, among others), but one example is that of the weight of a billet of material required for fabricating a structure: in some instances, a supplier may be capable of processing a billet of material weighing 1700 lbs. but may be unwilling to handle billets weighing more than 150 lbs. to ensure worker safety or reduce insurance costs, among other reasons. In another example, broaching may be associated with a CAD model. Broaching may be a feature or process that a supplier may not be willing to complete or cannot complete. In an example of a willingness limitation may be that shop may not have willingness to do grinding. A CAD model may indicate, after interrogating, that a surface needs to be ground flat or some sort of surface grinding technique needs to take place and a shop be capable of doing this but unwilling to do so.

As a further example, some suppliers may be capable of processing sheet metal using press brakes that can process 10 feet of material at a time, but the suppliers may only be willing to process sheet metal 6 feet at a time for shipping or other reasons, e.g., to protect profits, personnel, or machinery. As yet another example, some suppliers may be capable of running certain types of plastic through their injection molding machines but may be unwilling to run types known to be corrosive in order to ensure the longevity of the components, such as the barrels, of their injection molding machines. As a further example, a supplier may have employees who are capable of welding materials together that are only $15/1000$ of an inch thick but may not be willing to perform such welding because it is not profitable, and so they may define willingness data establishing a minimum material thickness for welding of $60/1000$ of an inch. As yet another example, here of stitching apparel, some suppliers may have the capability to stitch or sew heavy fabrics and materials like denim, canvas, and leather, but may be unwilling to do so in order to prevent unnecessary wear and tear on their sewing needles and other equipment or merely because they do not like dealing with their local supplier of such materials and do not wish to settle for a lower profit margin as a result of having to deal with long-distance suppliers.

Figure 5:
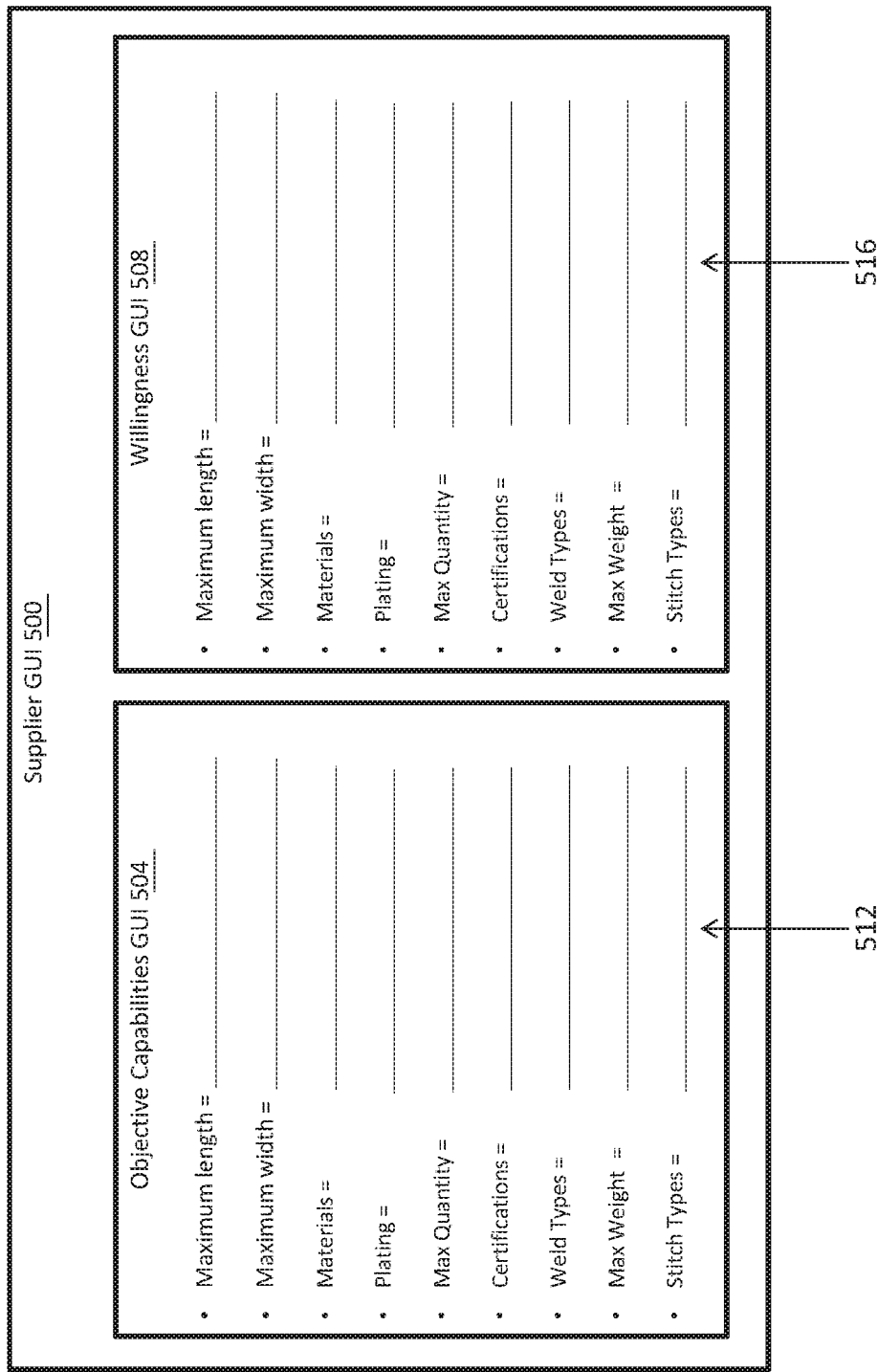
FIG. 5 is a representative screenshot depicting various aspects of an exemplary graphical user interface for an electronic pricing machine implemented in accordance with aspects of the invention.

FIG. 5 illustrates an example of a supplier user interface (UI) 500 that may be used in accordance with aspects of the present disclosure in order to obtain willingness data 356 and/or capabilities data 360 from a supplier or supplier's agent. In some embodiments, supplier UI 500 may be provided by marketplace 200 of FIG. 2, optionally via or in connection with supplier willingness defining module 316 and/or supplier capability defining module 328; additionally or alternatively, the supplier UI may be provided by a third-party via a website, dedicated application, or otherwise or via an in-house supplier program. As shown, supplier UI 500 includes an objective capabilities GUI 504 designed and configured to prompt a supplier representative to input objective capabilities information defining capabilities of the supplier. Such capabilities include, but are not limited to, capabilities based on fabrication equipment, handling equipment, shipping capabilities, materials constraints, finishing capabilities, and human resources, among others. Capabilities information collected via capabilities GUI 504 correspond to the supply parameters determined from an RFP, such as via an interrogator (e.g., interrogation engine 205) designed and configured to extract various fabrication parameters from CAD model 304 when present and/or from another part of the RFP. Objective capabilities GUI 504 includes a plurality of capabilities input features 512, here input fields, designed and configured for inputting corresponding differing types of objective capabilities information. After data is entered using capabilities input features 512, UI 500 may store the inputted objective capabilities information in an objective capabilities datastore, such as supplier database 220, as capabilities data 360, although other locations could be used.

UI 500 illustrated further includes a willingness GUI 508 designed and configured to prompt the supplier/supplier representative to input desired willingness limitations that indicate constraints that the supplier desires to impose based on considerations other than objective capabilities. Several examples of willingness limitations are described above in connection with FIG. 4. These willingness limitations collected via willingness GUI 508 correspond to supply parameters determined from an RFP, such as via an interrogator (e.g., interrogation engine 205) designed and configured to extract from the CAD model 304 data when present and/or from another part of the RFP. Willingness GUI 508 includes a plurality of willingness input features 516, here input fields, designed and configured for inputting corresponding differing types of willingness limitations. After data is entered using willingness input features 516, UI 500 may store the inputted willingness limitations in a willingness limitations datastore such as supplier database 220 as willingness data 356, although other locations could be used.

Notably, capabilities input features 512 and willingness input features 516 may be provided in one or more of various forms, such as text entry fields, radio buttons, selectable check boxes, and drop-down lists, among others. Further, in some embodiments, willingness GUI 508 may be automatically limited by selections entered in objective capabilities GUI 504 after values are entered into the objective capabilities GUI; similarly, in some embodiments, objective capabilities GUI 504 may be automatically limited by selections entered in willingness GUI 508 after values are entered into the willingness GUI. Further, in some implementations, only one or the other of objective capabilities GUI 504 and willingness GUI may be provided; this can be particularly useful in situations where suppliers do not wish to waste time entering objective capabilities data and only want to provide willingness data to marketplace 200.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

FIG. 6 shows a diagrammatic representation of one embodiment of a computing device in the exemplary form of a computer system 600 within which a set of instructions for causing a control system, such as the automated marketplace system 204 of FIG. 2, to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure; for example, each of marketplace 200, CAD program 208, and/or any client or supplier interfaces such as GUI 352 and supplier GUI 500 may be executed using a single device or any number of devices. Computer system 600 includes a processor 604 and a memory 608 that communicate with each other, and with other components, via a bus 612. Bus 612 may include any of several types of bus structures including, but not limited to, a memory bus, a memory controller, a peripheral bus, a local bus, and any combinations thereof, using any of a variety of bus architectures.

Memory 608 may include various components (e.g., machine-readable media) including, but not limited to, a random access memory component, a read only component, and any combinations thereof. In one example, a basic input/output system 616 (BIOS), including basic routines that help to transfer information between elements within computer system 600, such as during start-up, may be stored in memory 608. Memory 608 may also include (e.g., stored on one or more machine-readable media) instructions (e.g., software) 620 embodying any one or more of the aspects and/or methodologies of the present disclosure, such as one or more aspects of FIGS. 1-5. In another example, memory 608 may further include any number of program modules including, but not limited to, an operating system, one or more application programs, other program modules, program data, and any combinations thereof.

Computer system 600 may also include a storage device 624, which may be used to implement designer database 212 or supplier database 220, among other aspects of the present disclosure. Examples of a storage device (e.g., storage device 624) include, but are not limited to, a hard disk drive, a magnetic disk drive, an optical disc drive in combination with an optical medium, a solid-state memory device, and any combinations thereof. Storage device 624 may be connected to bus 612 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 624 (or one or more components thereof) may be removably interfaced with computer system 600 (e.g., via an external port connector, not shown). Particularly, storage device 624 and an associated machine-readable medium 628 may provide nonvolatile and/or volatile storage of machine-readable instructions, data structures, program modules, and/or other data for computer system 600, which in some implementations and embodiments may transform at least part of the computer system into an electronic pricing machine, as described hereinabove. In one example, software 620 may reside, completely or partially, within machine-readable medium 628. In another example, software 620 may reside, completely or partially, within processor 604.

Computer system 600 may also include an input device 632. In one example, a user of computer system 600 may enter commands and/or other information into computer system 600 via input device 632. Examples of an input device 632 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof, among others. Input device 632 may be interfaced to bus 612 via any of a variety of interfaces (not shown) including, but not limited to, a serial interface, a parallel interface, a game port, a USB interface, a FIREWIRE interface, a direct interface to bus 612, and any combinations thereof. Input device 632 may include a touch screen interface that may be a part of or separate from display 636, discussed further below. Input device 632 may be utilized as a user selection device for selecting one or more graphical representations in a graphical interface as described above.

A user may also input commands and/or other information to computer system 600 via storage device 624 (e.g., a removable disk drive, a flash drive, etc.) and/or network interface device 640. For example, a user may provide an RFP to marketplace 200 simply by connecting an appropriately configured device to an appropriate network. A network interface device, such as network interface device 640, may be utilized for connecting computer system 600 to one or more of a variety of networks, such as network 644, and one or more remote devices 648 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 644, may employ a wired and/or a wireless mode of communication. In general, any network topology may be used. Information (e.g., data, software 620, etc.) may be communicated to and/or from computer system 600 via network interface device 640.

Computer system 600 may further include a video display adapter 652 for communicating a displayable image, such as one or more prices and/or lists of suppliers, to a display device, such as display device 636. Examples of a display device include, but are not limited to, a liquid crystal display (LCD), a cathode ray tube (CRT), a plasma display, a light emitting diode (LED) display, and any combinations thereof. Display adapter 652 and display device 636 may be utilized in combination with processor 604 to provide graphical representations of aspects of the present disclosure. In addition to a display device, computer system 600 may include one or more other peripheral output devices including, but not limited to, an audio speaker, a printer, and any combinations thereof. Such peripheral output devices may be connected to bus 612 via a peripheral interface 656. Examples of a peripheral interface include, but are not limited to, a serial port, a USB connection, a FIREWIRE connection, a parallel connection, and any combinations thereof.

The foregoing has been a detailed description of illustrative embodiments of the invention. It is noted that in the present specification and claims appended hereto, conjunctive language such as is used in the phrases "at least one of X, Y and Z" and "one or more of X, Y, and Z," unless specifically stated or indicated otherwise, shall be taken to mean that each item in the conjunctive list can be present in any number exclusive of every other item in the list or in any number in combination with any or all other item(s) in the conjunctive list, each of which may also be present in any number. Applying this general rule, the conjunctive phrases in the foregoing examples in which the conjunctive list consists of X, Y, and Z shall each encompass: one or more of X; one or more of Y; one or more of Z; one or more of X and one or more of Y; one or more of Y and one or more of Z; one or more of X and one or more of Z; and one or more of X, one or more of Y and one or more of Z.

Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method performed by a computing system in communication with at least one client device across a network, the method comprising:
providing automated costing software to the computing system to transform at least part of the computing system into an electronic pricing machine, wherein the automated costing software includes an interrogation engine, a willingness engine, and a pricing engine;
receiving from a price requestor, by the electronic pricing machine via the at least one client device and the network, an electronic request for price (RFP) associated with computer-aided-design (CAD) model data representing a structure;
automatically executing, in response to receiving the RFP, the interrogation engine;
wherein the interrogation engine is configured to:
receive the electronic RFP and the CAD model data as inputs;
identify a discrete shape in the CAD model data as a function of a CAD command, wherein the discrete shape includes a geometric aspect;
determine a uniform thickness datum as a function of the discrete shape, wherein
determining the uniform thickness datum comprises:
identifying a thickness value;
determining that the structure has at least one solid body;
comparing vertexes of the at least one solid body face perpendicular to a base plane to the thickness value; and
comparing a perimeter of a top face of the at least one solid body to a perimeter of a bottom face of the at least one solid body;
compare the geometric aspect and the uniform thickness datum to a corresponding manufacturing requirement; and
generate a supply parameter as a function of the comparison of the geometric aspect to the corresponding manufacturing requirement, wherein the supply parameter indicates an objective requirement for fabricating the structure associated with the electronic RFP;
automatically generating, by the electronic pricing machine, a price/no-price determination indicating whether or not a possible supplier will provide a price to the price requestor, wherein the price/no-price determination includes a positive or negative determination, wherein generating the price/no-price determination includes running, by the electronic pricing machine, the willingness engine to automatically compare the supply parameter to one or more stored willingness limitations of the possible supplier, wherein the one or more stored willingness limitations of the possible supplier includes at least a weight limitation, and determining whether or not the supply parameter satisfies the one or more willingness limitations based on the comparison;
either running, by the electronic pricing machine, the pricing engine to generate a price as a function of the positive determination or not running, by the electronic pricing machine, the pricing engine as a function of the negative determination;
generating, as a function of the price/no-price determination, a filtered supplier list, wherein the filtered supplier list includes suppliers capable of fabricating the structure associated with the electronic RFP; and providing, when the electronic pricing machine generates the price, by the electronic pricing machine to a user interface via the network, the price for viewing of the price requestor on the user interface.

2. A method according to claim 1, wherein automatically generating a price/no-price determination further includes running, by the electronic pricing machine, an objective capabilities engine to automatically compare the supply parameter to stored objective capabilities information of the possible supplier so as to determine whether or not the supply parameter satisfies the objective capabilities information.

3. A method according to claim 2, wherein the objective capabilities information of the possible supplier is different from the willingness limitations of the possible supplier.

4. A method according to claim 1, wherein the willingness limitations include a dimensional limitation.

5. A method according to claim 1, wherein the willingness limitations include a material limitation.

6. A method according to claim 1, wherein the willingness limitations include a lead-time limitation.

7. A method according to claim 1, wherein the willingness limitations include a quantity limitation.

8. A method according to claim 1, wherein the willingness limitations include a certification limitation.

9. A method according to claim 1, wherein the willingness limitations include a process limitation.

10. A method according to claim 1, wherein the willingness limitations include a tolerance.

11. A system for an electronic pricing machine designed and configured to allow a supplier to provide a price in response to a request for price from a price requestor for supplying one or more instantiations of a structure represented by computer-aided-design (CAD) model data, the user interface comprising:

an interrogation engine designed and configured to:
receive an electronic request for price (RFP) and a CAD model data as inputs;
identify a discrete shape in the CAD model data as a function of a CAD command,
wherein the discrete shape includes a geometric aspect;
determine a uniform thickness datum as a function of the discrete shape,
wherein determining the uniform thickness datum comprises:
identifying a thickness value;
determining that the structure has at least one solid body;
comparing vertexes of the at least one solid body face perpendicular to a base plane to the thickness value; and
comparing a perimeter of a top face of the at least one solid body to a perimeter of a bottom face of the at least one solid body;
compare the geometric aspect and the uniform thickness datum to a corresponding manufacturing requirement; and
generate a supply parameter as a function of the comparison of the geometric aspect to the corresponding manufacturing requirement,
wherein the supply parameter indicates an objective requirement for fabricating the structure associated with the electronic RFP and a supplier willingness parameter associated with the objective requirement for fabricating the structure associated with the electronic RFP;

an objective capabilities graphical user interface (GUI) designed and configured to:
prompt a supplier representative to input objective capabilities information corresponding to the objective fabrication parameter that the interrogation engine is designed and configured to extract from the CAD model data when present, wherein the objective capabilities GUI includes a plurality of capabilities input features designed and configured for inputting corresponding differing types of objective capabilities information;
store the inputted objective capabilities information in an objective capabilities datastore; and
automatically generate a price/no-price determination indicating whether or not a possible supplier will provide a price to the price requestor, wherein the price/no-price determination includes a positive or negative determination, wherein generating the price/no-price determination includes comparing the supply parameter to one or more stored willingness limitations of the possible supplier, wherein the one or more stored willingness limitations of the possible supplier includes at least a weight limitation, and determining whether or not the supply parameter satisfies the one or more willingness limitations based on the comparison;
generating, as a function of the price/no-price determination, a filtered supplier list,
wherein the filtered supplier list includes suppliers capable of fabricating the structure associated with the electronic RFP; and a willingness GUI designed and configured to:
prompt the supplier representative to input desired willingness limitations corresponding to the supplier willingness parameter that the interrogation engine is designed and configured to extract from the CAD model data when present, wherein the willingness GUI includes a plurality of willingness input features designed and configured for inputting corresponding differing types of willingness limitations; and
store the inputted willingness limitations in a willingness limitations datastore.

12. A user interface according to claim 11, wherein the willingness limitations include a dimensional limitation.

13. A user interface according to claim 11, wherein the willingness limitations include a material limitation.

14. A user interface according to claim 11, wherein the willingness limitations include a plating limitation.

15. A user interface according to claim 11, wherein the willingness limitations include a quantity limitation.

16. A user interface according to claim 11, wherein the willingness limitations include a certification limitation.

17. A user interface according to claim 11, wherein the willingness limitations include a weld type limitation.

18. A user interface according to claim 11, wherein the willingness limitations include a stitch type limitation.

* * * * *